United States Patent
Atsumi

(10) Patent No.: US 6,972,446 B1
(45) Date of Patent: Dec. 6, 2005

(54) SEMICONDUCTOR INTEGRATED CIRCUIT DEVICE AND FLASH EEPROM

(75) Inventor: Shigeru Atsumi, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 1098 days.

(21) Appl. No.: 09/028,276

(22) Filed: Feb. 24, 1998

(30) Foreign Application Priority Data

Feb. 26, 1997 (JP) ................... 9-058347

(51) Int. Cl.[7] ........................................... H01L 27/10
(52) U.S. Cl. ..................................... 257/208; 257/202
(58) Field of Search .............................. 257/391, 392, 257/402, 202, 208

(56) References Cited

U.S. PATENT DOCUMENTS

| | | | | |
|---|---|---|---|---|
| 4,471,373 A | * | 9/1984 | Shimizu et al. | 257/392 |
| 4,823,175 A | * | 4/1989 | Fontana | 357/23.5 |
| 5,188,976 A | * | 2/1993 | Kume et al. | 438/258 |
| 5,600,164 A | * | 2/1997 | Ajika et al. | 257/392 |
| 5,780,893 A | * | 7/1998 | Sugaya | 257/318 |
| 5,847,432 A | * | 12/1998 | Nozaki | 257/392 |
| 6,667,511 B1 | * | 12/2003 | Fang | 257/321 |

FOREIGN PATENT DOCUMENTS

| | | | | |
|---|---|---|---|---|
| JP | 63-236354 | | 10/1988 | |
| JP | 63-252459 | | 10/1988 | |
| JP | 03196677 A | * | 8/1991 | ......... H01L 29/784 |
| JP | 4-163798 | | 6/1992 | |
| JP | 04-365373 | | 12/1992 | |
| JP | 05-006665 A | | 1/1993 | |
| JP | 05-259289 A | | 10/1993 | |
| JP | 06-188387 A | | 7/1994 | |
| JP | 07-169293 A | | 7/1995 | |
| JP | 08-204142 A | | 8/1996 | |

* cited by examiner

Primary Examiner—Allan R. Wilson
(74) Attorney, Agent, or Firm—Banner & Witcoff, Ltd.

(57) ABSTRACT

A number of transistors including gate oxide films of different thicknesses and an external terminal are formed on a semiconductor substrate. The transistor connected directly to the external terminal is a transistor other than the transistor having the thinnest gate oxide film. That is, a node which is in contact with an external power supply and thus requires a high breakdown voltage is formed of a thick gate oxide film transistor, while a node which is not in contact with the external power supply is formed of a thin gate oxide film transistor. With this structure, a number of transistors including gate oxide films of different thicknesses can be integrated in a single chip without deterioration of the transistor characteristics. Hence, the degree of freedom with which to design devices/circuits can be remarkably enhanced.

20 Claims, 12 Drawing Sheets

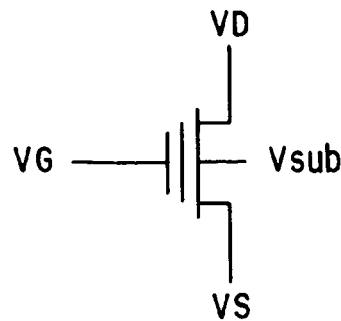
FIG. 1A
(PRIOR ART)
FIG. 1B
(PRIOR ART)
|  | VD | VG | VS | Vsub |
|---|---|---|---|---|
| READ | 1 V | 5 V | 0 V | 0 V |
| WRITE | 5 V | 10V | 0 V | 0 V |
| ERASURE | OPEN | -7 V | 6 V | 0 V |
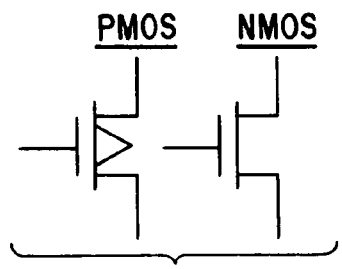
FIG. 2A
(PRIOR ART)
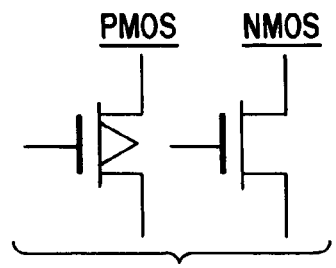
FIG. 2B
(PRIOR ART)
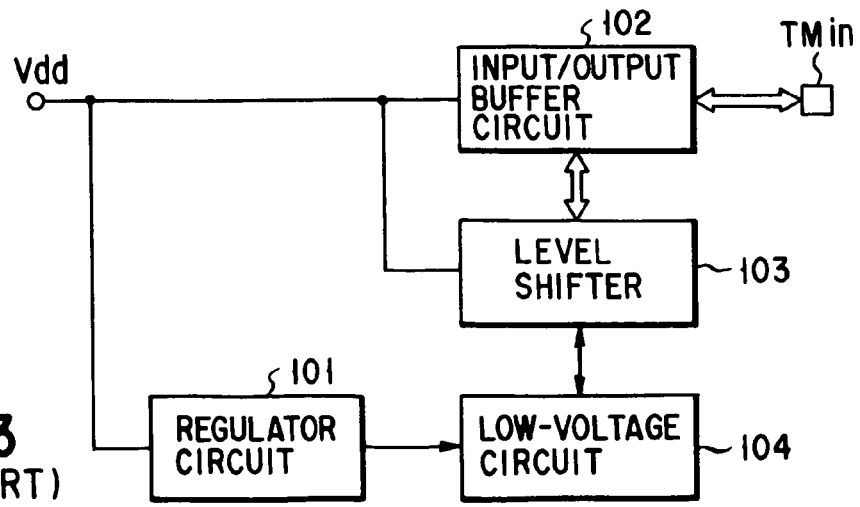
FIG. 3
(PRIOR ART)

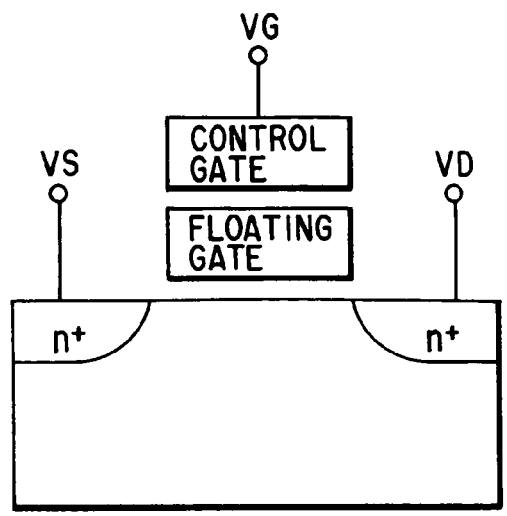
F I G. 17A
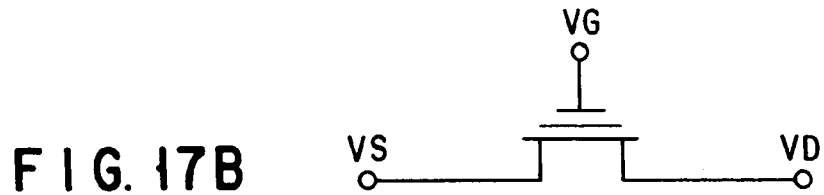
F I G. 17B
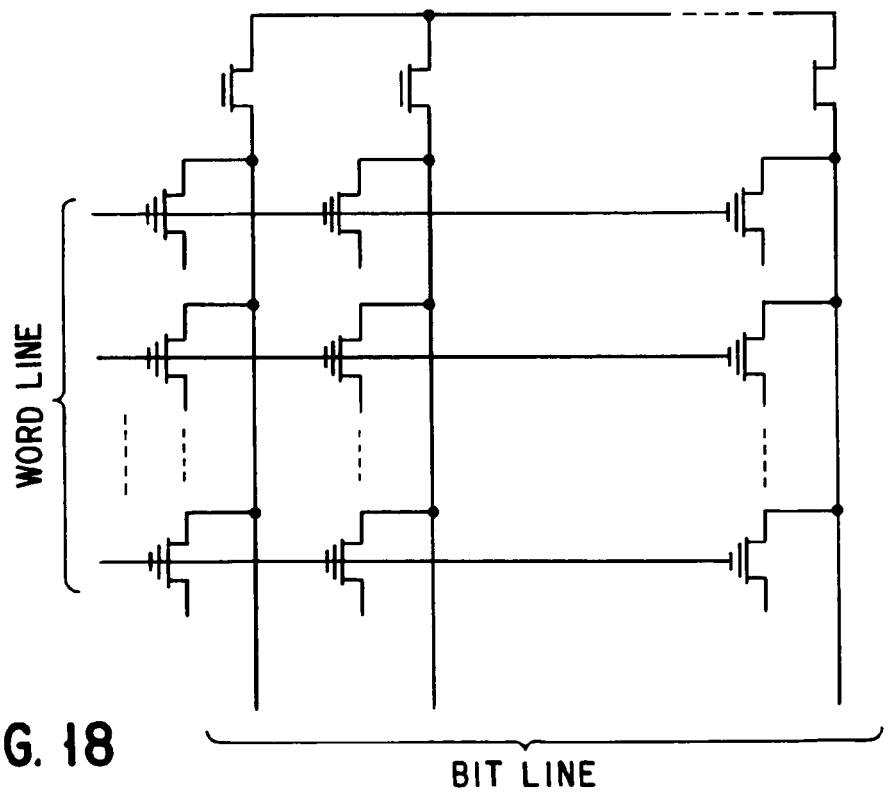
F I G. 18

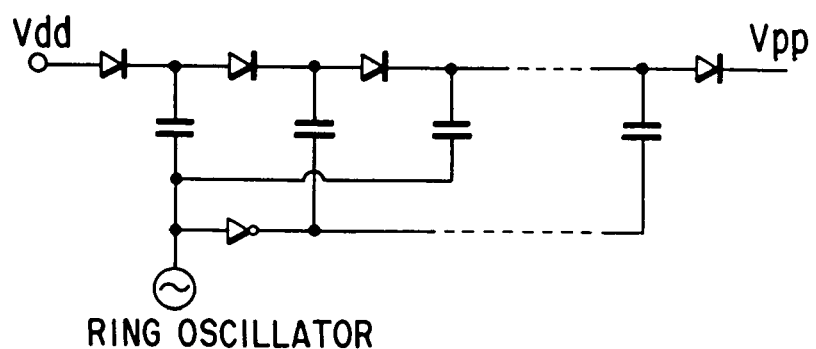
F I G. 19
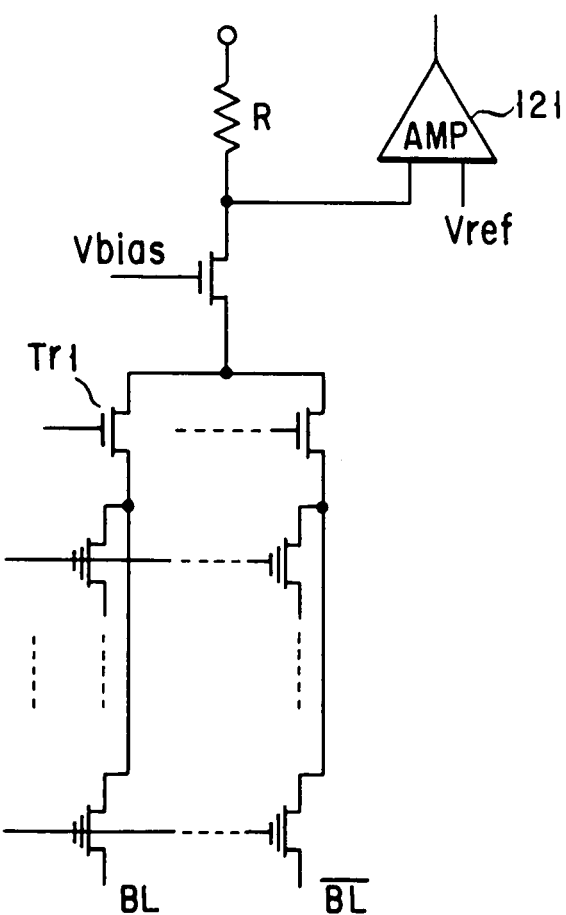
F I G. 20

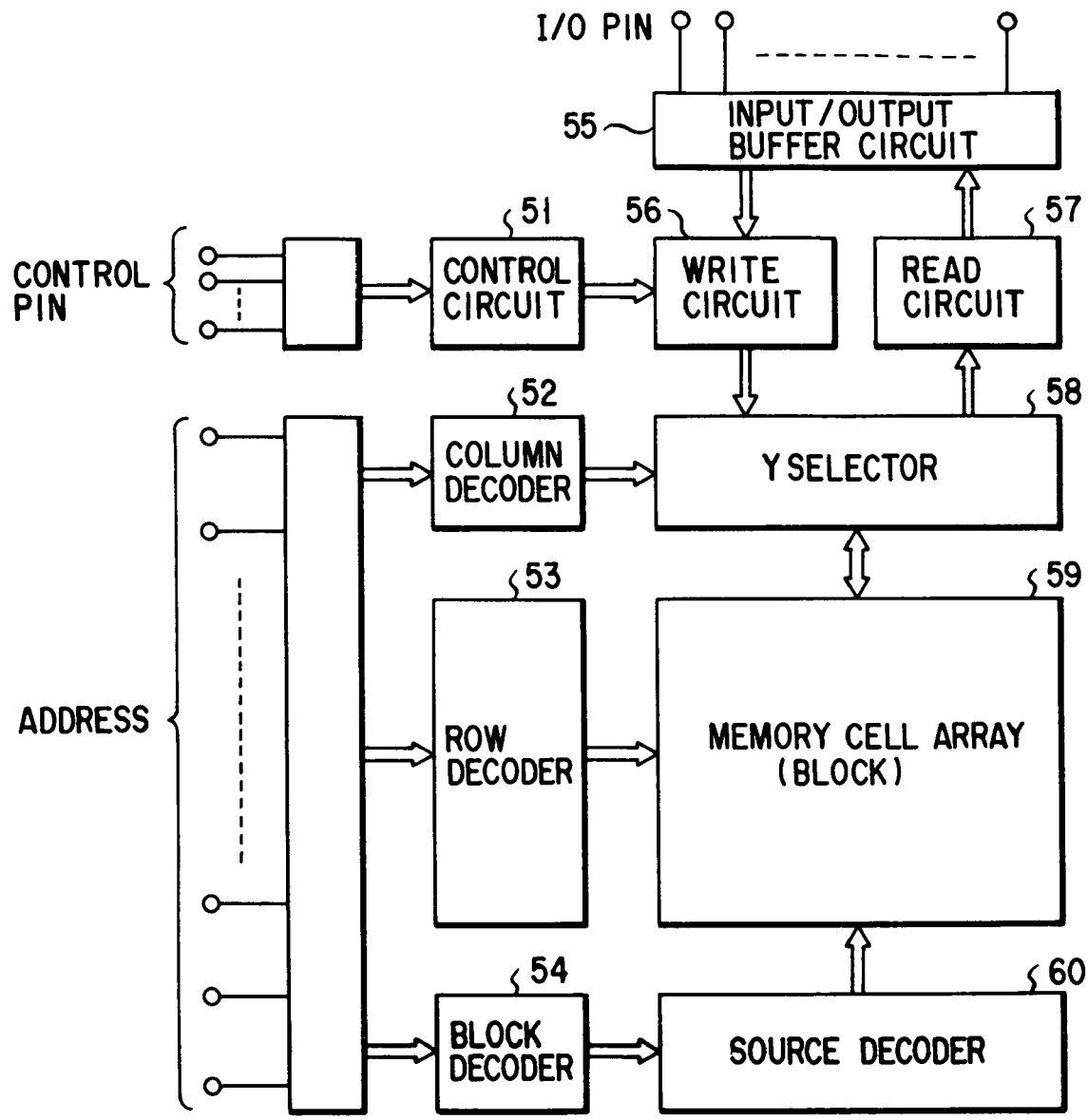
F I G. 21

SEMICONDUCTOR INTEGRATED CIRCUIT DEVICE AND FLASH EEPROM

BACKGROUND OF THE INVENTION

The present invention relates to a semiconductor integrated circuit device wherein a plurality of transistors are integrated in one chip, and also to a flash EEPROM (electrically erasable programmable read-only memory).

In most conventional semiconductor integrated circuit devices, transistors having gate oxide films of the same thickness are integrated in one chip, and transistors having gate oxide films of different thicknesses are not integrated therein. As described below, however, this structure gives rise to a variety of problems in a flash EEPROM or another memory device that requires application of a high voltage for the writing or erasing data with reference to a memory cell.

FIG. 1A is a circuit diagram showing a transistor used in a NOR type flash memory, and FIG. 1B is a table showing the voltages that are applied at the time of read, write and erase operations.

A flash EEPROM is a semiconductor memory including laminated gate type nonvolatile memory cells. Data can be electrically written therein and collectively erased therefrom. In the case of a NOR type flash memory, the voltage internally used for a write operation is 10V as against a power supply voltage of 3V. The voltage difference is more than three times. Likewise, the voltage used for an erase operation is also high.

In general, the breakdown voltage of a gate oxide film of a transistor is 10 MV/cm or so. (The breakdown voltage of a gate insulation film is expressed as a maximum electric field that the oxide film can withstand; in other words, the oxide film would break down if an electric field greater than that maximum electric field is applied thereto.) The thinness of the gate oxide film is determined by the voltage applied to the transistor. Normally, an electric field which is less than the half of an electric field leading to breakdown (i.e., 0.5 MV/cm or so) is used as the upper limit of an electric field which can be applied to the gate oxide film.

The performance of a transistor is largely dependent on the thinness (or thickness) of the gate oxide film. The thinner the gate oxide film is, the more the performance of the transistor will improve in accordance with the scaling rule.

In the case of a NOR type flash memory, the voltage applied to the gate in one mode differs from that in another mode by more than three times (i.e., 10V as against 3V). If the voltage applied to the gate is 10V, the oxide film of the transistor must be 3.3 times thicker in comparison with the case where the voltage applied to the gate is 3V.

In order to satisfy all requirements by use of gate oxide films of the same thickness, the minimum thickness of the gate oxide film is 20 nm or so, since it must be determined in consideration of the breakdown voltage mentioned above. If all transistors are formed of an oxide film that copes with application of a voltage of 10V, then the following problems occur in a transistor to which 3V is applied:

(i) The transistor deteriorates in characteristic. Due to the thick gate oxide film, the conductance gm is inevitably small. (ii) The threshold cannot be lowered. Since the threshold voltage Vth of the transistor changes in proportion to both the square root of the impurity concentration of the channel and the thickness of the gate oxide film, a transistor designed for the application of 10V has such a large threshold that there is not enough circuit margin for low voltages. (iii) An increase in the layout area is inevitable. Since the transistor designed for the application of 10V is applied with high voltages, the design rules are broad. This results in an increase in the size of the transistor.

Of these problems, problems (i) and (ii) are particularly serious in the case of a recent logic device that contains both a memory and a flash memory.

Under these circumstances, a low voltage applied transistor and a high voltage applied transistor are prepared independently of each other in the process of making a flash memory that operates on a power supply voltage Vdd of 3V or less. To be specific, a transistor operating on a power supply voltage Vdd of 3V or less (namely, a low voltage applied transistor) and a transistor operating on a power supply voltage Vdd of 10V (namely, a high voltage applied transistor) are prepared independently in different steps, and the gate oxide films which form the transistors are also prepared independently.

FIGS. 2A and 2B show how to make a distinction between the two different types of transistors by use of different transistor symbols.

A transistor whose gate is depicted with a thin line (FIG. 2A) is a transistor having a thin gate oxide film (hereinafter referred to as a thin gate oxide film transistor). This type of transistor corresponds to the low voltage applied transistor described above. In contrast, a transistor whose gate is depicted with a thick line (FIG. 2B) is a transistor having a thick gate oxide film (hereinafter referred to as a thick gate oxide film transistor). This type of transistor corresponds to the high voltage applied transistor described above. In the descriptions below, the thin and thick gate oxide film transistors may be referred to as low- and high voltage applied transistors, respectively, when the use of the latter terms is desirable for easy understanding.

In the conventional art, a transistor to which a power supply voltage Vdd is applied directly, a transistor to which a voltage equivalent to the power supply voltage is applied, or a transistor which serves as an interface section (e.g., an input/output buffer circuit) with reference to an external circuit is made of a low voltage applied transistor. This is because the use of the low voltage applied transistor is expected to ensure improved performance of a transistor operating on power supply voltage Vdd, thus enhancing the chip performance.

However, this system has the following problems (1) to (4):

(1) In accordance with the recent trend toward miniaturization of transistors, it will become more and more general to adopt the technique of internally lowering the power supply voltage (i.e., the technique of lowering the external power supply voltage Vdd and operating the internal elements on the lowered voltage). If the adoption of this technique becomes more general, it is likely that the breakdown voltage of the low voltage applied transistor will be lower than the power supply voltage Vdd.

FIG. 3 is a simplified block circuit diagram showing a power supply system that performs internal voltage lowering. Referring to this figure, Vdd denotes a voltage which is externally applied to the chip as a power supply voltage. This voltage is applied to a regulator circuit 101, an input/output buffer circuit 102 and a level shifter 103, all of which are formed in the chip. A voltage controlled by the regulator circuit 101 is applied to the major circuits formed in the chip, and the major circuits are made to function as a low-potential system.

The internally lowered potential obtained by the regulator circuit 101 is supplied to a low-voltage circuit 104, and a signal output from the low-voltage circuit 104 is supplied to the input/output buffer 102 after it is subjected to the potential conversion by the level shifter 103. The input/output buffer circuit 102 performs a buffering operation for input/output data at the power supply voltage Vdd.

FIG. 4 shows an example of an internal structure of a regulator circuit 101.

As is shown, the regulator circuit 101 is made up of the following: a differential amplifier 112 whose negative input terminal receives a reference voltage Vref generated by a reference voltage generating circuit 111; a PMOS transistor P110 whose gate is connected to the output terminal of the differential amplifier 112 and whose source is connected to a node of power supply voltage Vdd; an NMOS transistor N110 whose drain and gate are connected to the drain of the PMOS transistor P110; an NMOS transistor N109 whose gate is connected to the drain of the PMOS transistor P110 and whose drain is connected to the node of power supply voltage Vdd; and resistors R1 and R2 which are connected in series to the source of the NMOS transistor N110 and the middle point C between resistors R1 and R2 which is connected to the positive input terminal of the differential amplifier 112. From the regulator circuit 101 having this circuit structure, internal power supply voltage Vddint is generated.

Turning back to FIG. 3, a description will be given of the voltage which the power supply system shown in FIG. 3 applies to a transistor. With respect to the internal portion of the chip, the voltage stress can be relieved by the internal voltage lowering. As for the interface section (including the input/output buffer circuit 102, the regulator circuit 101, etc.), however, the power supply voltage Vdd is applied directly thereto. Since the breakdown voltage of the interface section must be increased to withstand the voltage application, the miniaturization of the transistor is prevented.

(2) With respect to the interface section, the problem related to the three-level control normally executed for a flash EEPROM has to be pointed out. That is, it is necessary to deal with the case where a voltage far higher than Vdd is sensed as the third level when that voltage is applied to the input pin (input terminal). FIG. 5 shows an example of a high voltage sensing circuit adapted to sense the third level input. Although a voltage of 12V is often used as the third level, it is four times as high as the normal rated voltage in the case of a transistor operating on a power supply voltage of 3V. This problem gives rise to a more serious situation than problem (1).

(3) In addition, the problem related to ESD (electro-static discharge) has to be pointed out. If the package is electrostatically charged, there may be a case where a high voltage will be instantaneously applied to the pin (input/output terminal) of the semiconductor integrated circuit device. In many cases, such undesirable voltage application is dealt with by arranging a protective element (a backward diode or a parasitic bipolar device) in the vicinity of the pad (i.e., input terminal TMin), as shown in the circuit diagrams and semiconductor substrate sectional views of FIGS. 6A to 6D. The protective element prevents the excessive voltage from being applied to the internal elements of the integrated circuit. As the protective element, a protective bipolar transistor (FIG. 6A), a parasitic npn bipolar transistor formed between two n+ diffusion regions (FIG. 6B), a parasitic npn bipolar transistor utilizing the surface breakdown of an MOS transistor (FIG. 6C) or the like is used.

The backward diode is made of a PN junction, but the breakdown voltage is not necessarily scaled in proportion to the extent of the miniaturization of the gate oxide film. If the extent of the miniaturization is great, it may happen that the voltage at which the oxide film breaks down will be lower than the breakdown voltage of the PN junction. Accordingly, ESD gives rise to a serious problem with respect to a miniaturized device.

(4) Lastly, a description will be given of a problem regarding a node which is applied directly with power supply voltage Vdd in the case where internal voltage lowering is carried out. Even in the case where the internal voltage lowering is carried out, there is a node to which power supply voltage Vdd is directly applied. If an excessive voltage is applied to this node, the gate oxide film of the transistor may be destroyed. Even if the gate oxide film remains undestroyed, the device is adversely affected. There may be a case where the oxide film cannot be subjected to the scaling due to the excessive voltage applied to the interface.

In view of the problems described above, there is a demand for a technique that enables both low- and high voltage applied transistors based on gate oxide films of different thicknesses to be integrated in a single chip without deterioration of the transistor characteristics.

BRIEF SUMMARY OF THE INVENTION

Accordingly, it is an object of the present invention to provide a semiconductor integrated circuit device wherein a plurality of transistors based on gate oxide films of different thicknesses are integrated in a single chip without deterioration of the transistor characteristics.

According to one aspect of the present invention, there is provided a semiconductor integrated circuit device comprising: a semiconductor substrate on which a plurality of transistors including gate insulation films of different thicknesses are formed; and an input/output terminal formed on the semiconductor substrate, a transistor connected directly to the input/output terminal being one of the transistors other than a transistor having the thinnest gate insulation film.

According to another aspect of the present invention, there is provided a flash EEPROM (electrically erasable programmable read-only memory) comprising: a memory cell array formed on a semi-conductor substrate; and a control circuit, formed on the semiconductor substrate and connected to a plurality of memory cells that constitute the memory cell array, for controlling nodes of the memory cells, the control circuit including a Y-selector whose gate is applied with an internally boosted voltage at a time of reading.

According to still another aspect of the present invention, there is provided a flash EEPROM (electrically erasable programmable read-only memory) comprising: a memory cell array formed on a semi-conductor substrate; and a control circuit, formed on the semiconductor substrate and connected to a plurality of memory cells that constitute the memory cell array, for controlling nodes of the memory cells, the control circuit including a source decoder whose NMOS driver gate is applied with an internally boosted voltage at a time of reading.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B show a NOR type flash EEPROM cell and the operating voltages at some nodes thereof;

FIGS. 2A and 2B show different transistor symbols used for distinction;

FIG. 3 is a block circuit diagram showing a power supply system that performs internal voltage lowering;

FIGS. 17A and 17B are a sectional view of a nonvolatile memory cell and an equivalent circuit diagram of the nonvolatile memory cell;

FIG. 18 is a circuit diagram of the memory cell array of a flash EEPROM;

FIG. 19 is a circuit diagram showing a booster circuit of the flash EEPROM;

FIG. 20 is a circuit diagram showing a read circuit of the flash EEPROM;

FIG. 21 is a schematic block circuit diagram of the flash EEPROM; and

DETAILED DESCRIPTION OF THE INVENTION

An embodiment of the present invention will now be described with reference to the accompanying drawings.

Figure 7:
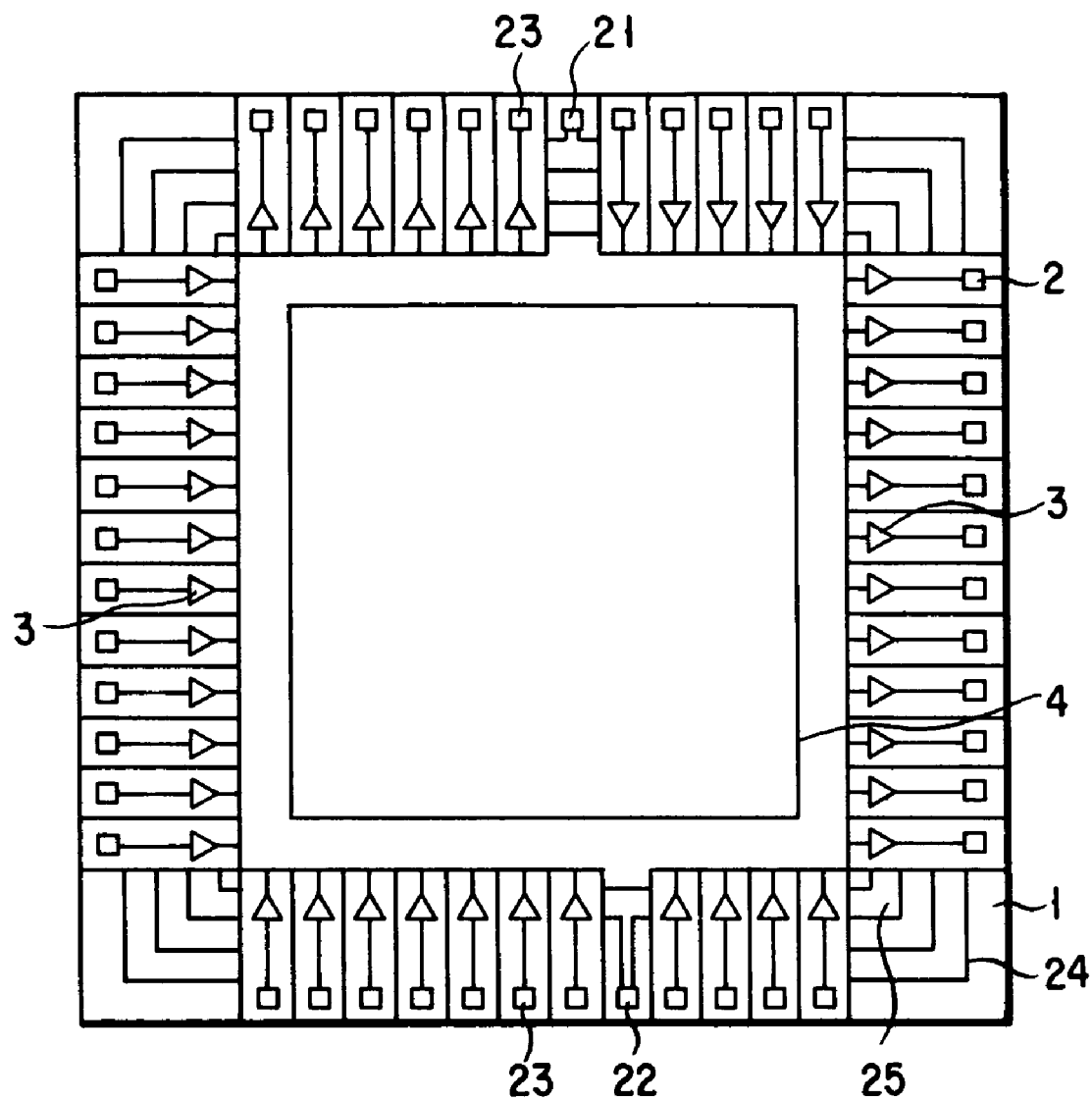
FIG. 7 is a plan view showing a semiconductor integrated circuit device according to one embodiment of the present invention.

FIG. 7 is a schematic plan view showing the surface of a semiconductor substrate which is made of silicon, for example, and on which a semiconductor integrated circuit device is formed.

Referring to FIG. 7, a plurality of external terminals 2, including input/output terminals (TMin/TMout) 23, a power supply terminal (Vdd) 21 and a ground terminal (GND) 22, are arranged at the peripheral regions of a semiconductor substrate 1. An internal circuit 4, which is an integrated circuit functioning as a memory cell array, is formed inside the semiconductor substrate 1. The internal circuit 4 is connected to the external terminals 2 by way of interface circuits 3. A power supply line 24 and a ground line 25, which are connected to the power supply terminal 21 and the ground terminal 22, respectively, are formed on the semiconductor substrate 1.

According to the embodiment, MOS transistors connected directly to the power supply terminal 21 and input/output terminal 23 are made of thick gate oxide film transistors (see FIG. 2B). The thickness of the oxide films of these transistor is greater than 10 nm, and preferably within the range of 12 to 20 nm. Within this thickness range, a voltage of 5V can be applied. A MOS transistor that is not connected directly to the power supply terminal 21 or the input/output terminal 23 is made of a thin gate oxide film transistor (see FIG. 2A). The thickness of the oxide film of this transistor is determined to be less than 10 nm, preferably less than 8 nm or so, since a voltage of 5V need not be applied.

Various kinds of circuits corresponding to the interface circuits 3 will be described, with specific examples being referred to.

Figure 8:
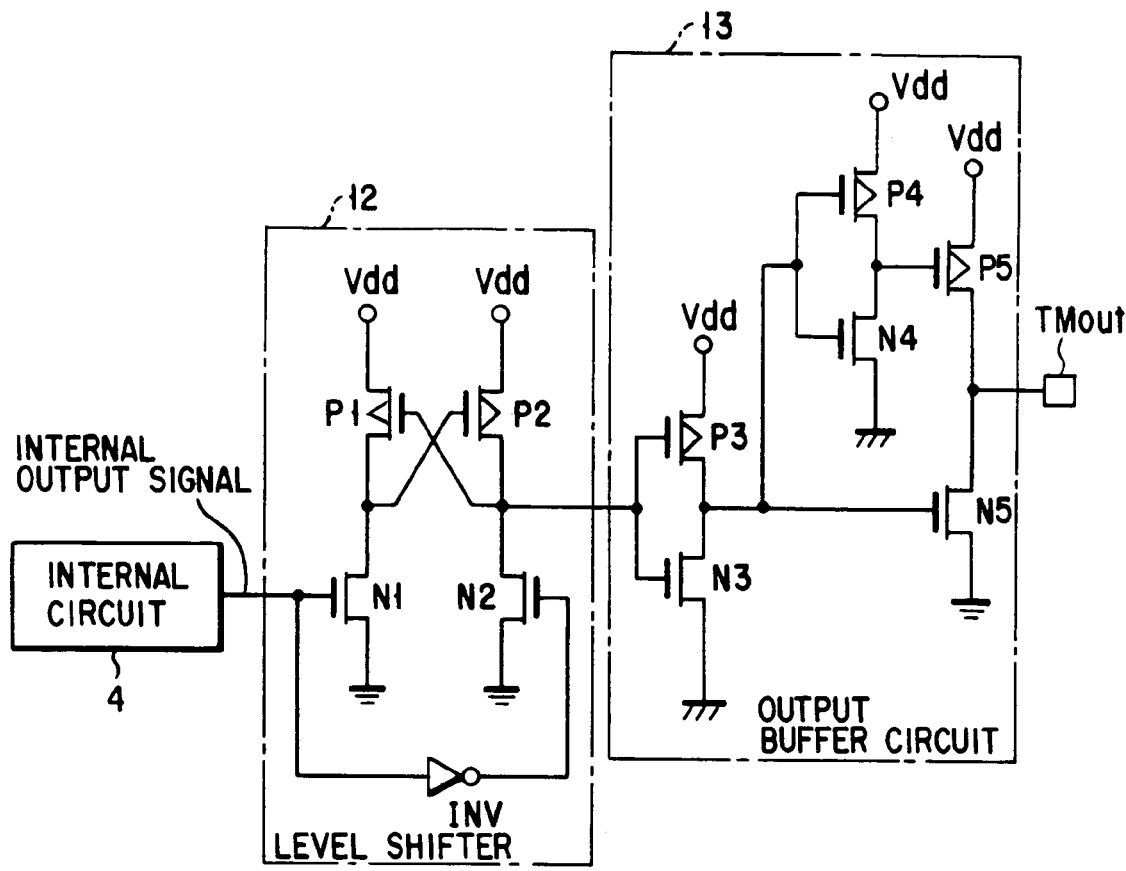
FIG. 8 is a circuit diagram showing a level shifter circuit and an output buffer circuit, both of which are employed in the semiconductor integrated circuit device of the embodiment.

FIG. 8 is a circuit diagram showing a level shifter circuit and an output buffer circuit, both of which are formed on the semiconductor substrate 1.

Referring to FIG. 8, an internal output signal supplied from the internal circuit 4 is first subjected to the level conversion by the level shifter 12, and is then supplied to the output buffer circuit 13. The internal output signal is output from the output terminal TMout of the output buffer circuit 13.

The level shifter 12 is made up of PMOS transistors P1 and P2, NMOS transistors N1 and N2, and inverter circuit INV. The PMOS transistors P1 and P2 are made of thick gate oxide film transistors since a power supply voltage Vdd is applied to their sources. The drains of the PMOS transistors P1 and P2 are connected to the drains of the NMOS transistors N1 and N2, and these NMOS transistors N1 and N2 are also made of thick gate oxide film transistors. The inverter circuit INV is connected between the gates of the NMOS transistors N1 and N2 in such a manner that an output from the inverter circuit INV is supplied to the gate of NMOS transistor N2. The gate of PMOS transistor P1 is connected to the connection point between PMOS transistor P2 and NMOS transistor N2. Likewise, the gate of PMOS transistor P2 is connected to the connection point between PMOS transistor P1 and NMOS transistor N1.

The output buffer circuit 13 is made up of PMOS transistors P3, P4 and P5 and NMOS transistors N3, N4 and N5. PMOS transistor P3 and NMOS transistor N3 jointly constitute an inverter circuit. Likewise, PMOS transistor P4 and NMOS transistor N4 jointly constitute an inverter circuit. PMOS transistor P3, PMOS transistor P4, and PMOS transistor P5 (which is connected to an output terminal TMout) are made of thick gate oxide film transistors since power supply voltage Vdd is applied to their sources. NMOS transistors N3, N4 and N5, which are connected to the PMOS transistors P3, P4 and P5, respectively, are also made of thick gate oxide film transistors.

As described above, the transistors connected directly to the external terminals (including the power supply terminal 21 (Vdd) and the output terminal 23 (TMout)), are made of thick gate oxide film transistors, namely high voltage applied transistors. It is desirable that a transistor having a current path connected between the power supply terminal 21 (Vdd) and the ground terminal be also made of a thick gate oxide film transistor. The other transistors, such as transistors constituting inverter circuit INV to which a level-lowered potential is applied, are made of thin gate oxide film transistors.

In the embodiment described above, a voltage whose level has been shifted to the level of power supply voltage Vdd is applied to the transistors of the output buffer circuit. Even where the internal voltage lowering is not performed, at least those transistors (i.e., transistors P5 and N5 shown in FIG. 8) of the output buffer circuits which are connected directly to the output terminal TMout are made of high voltage applied transistors. With this structure, it is possible to satisfactorily cope with ESD which gives rise to a problem in the prior art. In this case, the other transistors (i.e., transistors P3, N3, P4 and N4 shown in FIG. 8) in the output buffer circuits may be formed of low voltage applied transistors.

Figure 9:
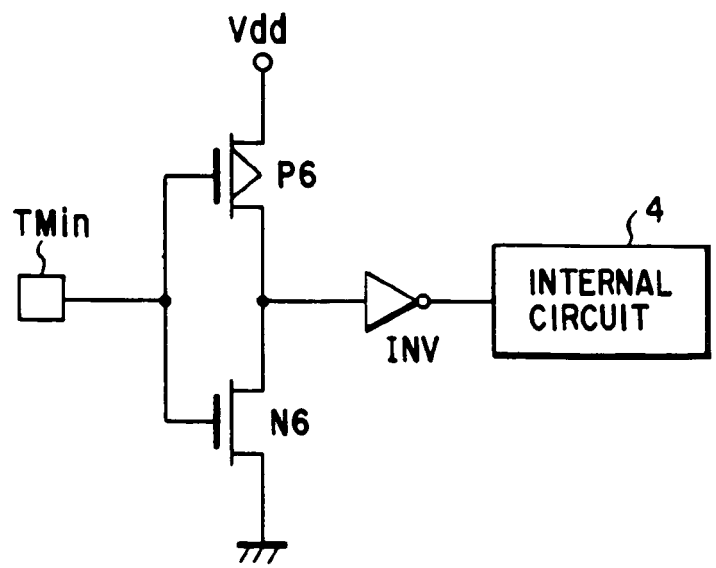
FIG. 9 is a circuit diagram showing an input buffer circuit, which is employed in the semiconductor integrated circuit device of the embodiment.

FIG. 9 is a circuit diagram showing an input buffer circuit formed on the semiconductor substrate 1.

In the input buffer circuit shown in FIG. 9, power supply voltage Vdd is applied to the transistors that are connected directly to the signal input terminal, as in the case shown in FIG. 8. PMOS transistor P6 and NMOS transistor N6, the gates of which are connected to the input terminal TMin, constitute an inverter and are formed of thick gate oxide transistors. The source of PMOS transistor P6 is connected to a node of power supply voltage Vdd. Transistors P6 and N6 are connected to the internal circuit 4 by way of an inverter INV. This structure is effective in solving the problem of ESD.

Figure 10:
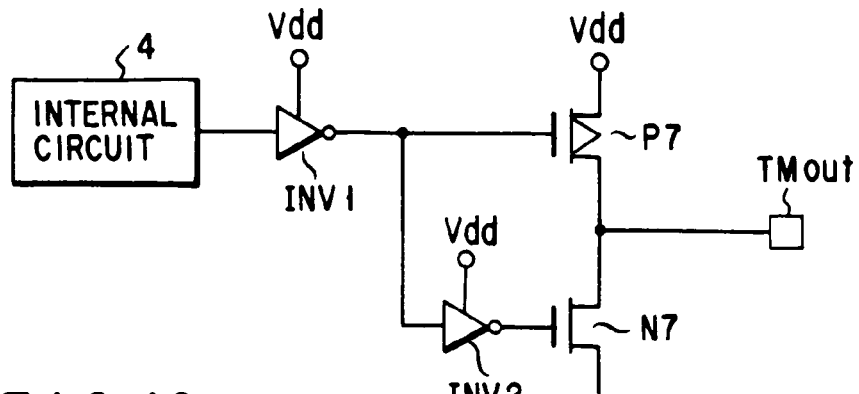
FIG. 10 is a circuit diagram showing an output buffer circuit, which is employed in the semiconductor integrated circuit device of the embodiment.

FIG. 10 is a circuit diagram showing an output buffer circuit formed on the semiconductor substrate 1. In order to provide a sufficiently high breakdown voltage against ESD, those transistors of the output buffer circuit which are connected directly to the output terminal TMout are made of thick gate oxide film transistors. Specifically, PMOS transistor P7 and NMOS transistor N7, which are connected in series with each other, are made of thick gate oxide film transistors, and power supply voltage Vdd is applied to the source of PMOS transistor P7. Inverters INV1 and INV2 are connected to transistors P7 and N7, and the transistors constituting the inverters INV1 and INV2 are made of thin gate oxide film transistors, namely, low voltage applied transistors.

Figure 11:
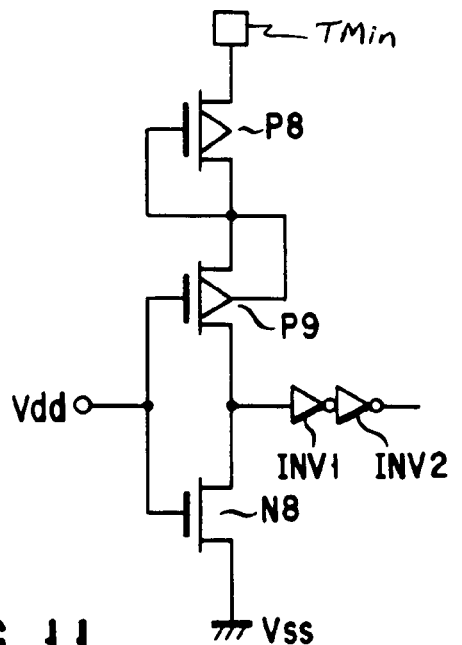
FIG. 11 is a circuit diagram showing a high voltage sensing circuit (three-level input control circuit), which is employed in the semiconductor integrated circuit device of the embodiment.

FIG. 11 is a circuit diagram showing a high voltage sensing circuit.

Figure 4:
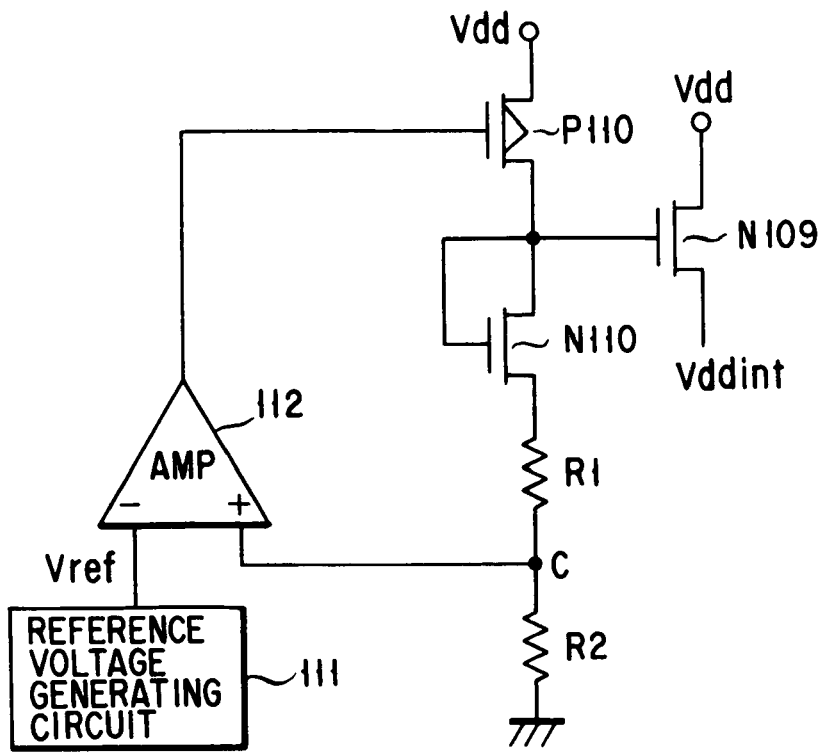
FIG. 4 shows a regulator circuit.
Figure 5:
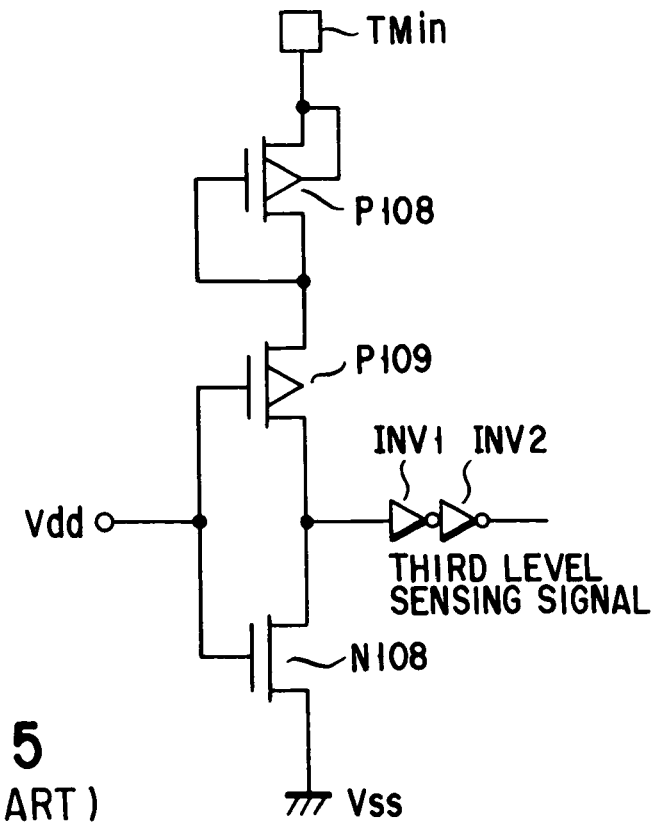
FIG. 5 shows a circuit for sensing the third level input.
Figure 6A:
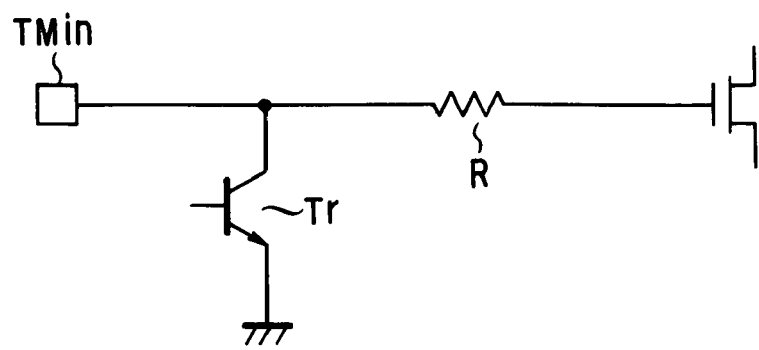
FIGS. 6A to 6D are circuit diagrams of a terminal protecting element and sectional views of a semi-conductor substrate.
Figure 6B:
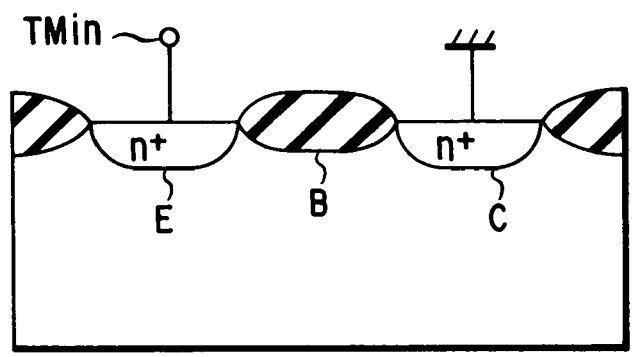
Figure 6C:
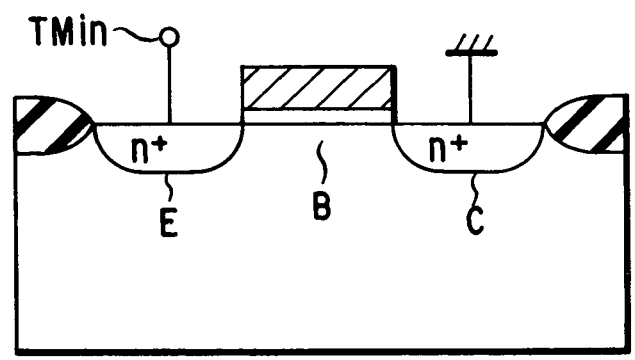
Figure 6D:
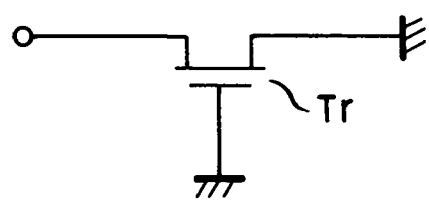

This circuit is similar to the conventional high voltage sensing circuit shown in FIG. 5 in fundamental constitution, but differs therefrom in that the transistor connected to input terminal TMin and the transistor whose gate is applied with power supply voltage Vdd are made of thick gate oxide film transistors. To be more specific, the circuit includes the following transistors: PMOS transistor P8 having a source which is at the same potential level as the substrate and connected to the input terminal TMin, and a gate and a drain connected together; PMOS transistor P9 having a source which is connected to the drain of PMOS transistor P8; and NMOS transistor N8 having a drain connected to the drain of PMOS transistor P9 and a source connected to a node of ground potential Vss. These transistors are made of thick gate oxide film transistors. A third level sensing signal is output from the circuit after passing through inverters INV1 and INV2.

In a flash EEPROM of the type which is adopted in the present invention, there has been the following problem. That is, the problem occurs when the three-level control is executed (i.e., the case where a voltage far higher than Vdd is sensed as being the third level when that voltage is applied to the input terminal). Although a voltage of 12V is often used as the third level, it is four times as high as the normal rated voltage in the case of a transistor operating on a power supply voltage of 3V. This problem gives rise to a more serious situation than problem (1) described above in the conventional technique, but the use of thick gate oxide film transistors in the sensing circuit solves the problem.

Figure 12:
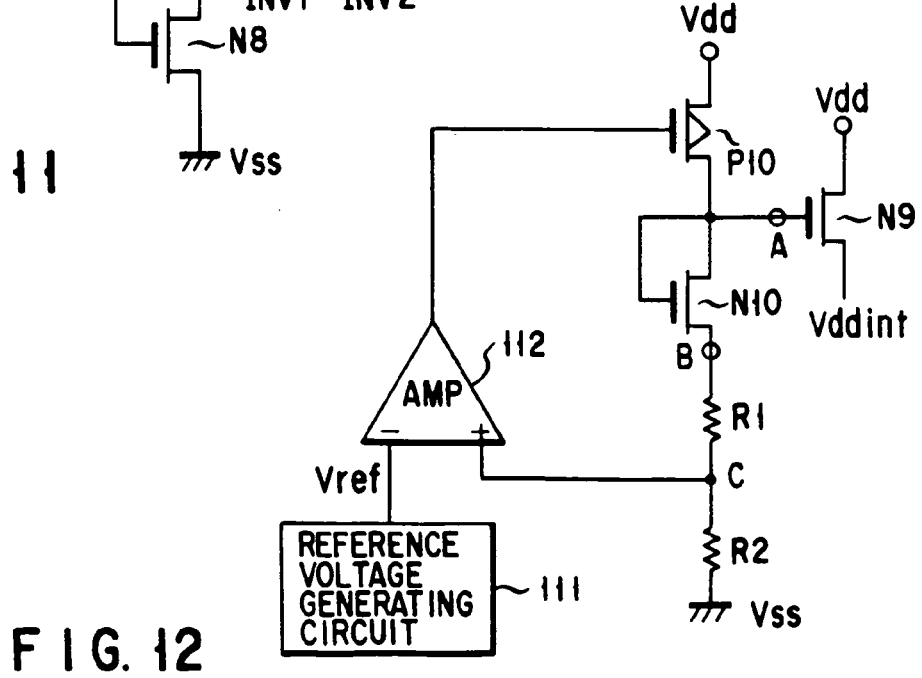
FIG. 12 is a circuit diagram showing an internal power supply voltage-lowering circuit, which is employed in the semiconductor integrated circuit device of the embodiment.

FIG. 12 is a circuit diagram of the regulator circuit.

This circuit is similar to the conventional regulator circuit shown in FIG. 5 in fundamental constitution, but differs therefrom in that the transistor to which power supply voltage Vdd is applied and the transistor whose current path is connected between the power supply terminal Vdd and the ground terminal are made of thick gate oxide film transistors. The power supply system including the voltage-lowering circuit is similar to that of the conventional art and can be regarded as being illustrated in FIG. 3. As described above, Vdd is a voltage which is externally applied to the chip as a power supply voltage. This voltage, Vdd, is applied to the regulator circuit 101, the input/output buffer circuit 102 and the level shifter 103, which are formed inside the chip. The major internal circuits in the chip are applied with a voltage lowered by the regulator circuit 101, and function as a low-voltage system.

The regulator circuit 101 shown in FIG. 12 is made up of the following: a differential amplifier 112 whose negative input terminal receives a reference voltage Vref generated by a reference voltage generating circuit 111; a PMOS transistor P10 whose gate is connected to the output terminal of the differential amplifier 112 and whose source is connected to a node of power supply voltage Vdd; an NMOS transistor N10 whose drain and gate are connected to the drain of the PMOS transistor P10; an NMOS transistor N9 whose gate is connected to the drain of the PMOS transistor P10 and whose drain is connected to the node of power supply voltage Vdd; and resistors R1 and R2 which are connected in series to the source of the NMOS transistor N10 and the middle point C between resistors R1 and R2 which is connected to the positive input terminal of the differential amplifier 112. From the regulator circuit 101 having this circuit structure, internal power supply voltage Vddint is generated.

According to the embodiment, PMOS transistor P10 and NMOS transistors N9 and N10 are made of thick gate oxide film transistors, the use of which characterizes the present invention. As for transistors which are connected directly to the output node of the regulator circuit and operate on a lowered-potential level, thin gate oxide film transistors are employed.

A description will now be given of the process in which to manufacture a semiconductor integrated circuit device that includes both thick gate oxide film transistors (high voltage applied transistors) and thin gate oxide film transistors (low voltage applied transistors), and the sectional views shown in FIGS. 13A and 13B through FIGS. 16A and 16B will be referred to in the descriptions below.

The semiconductor integrated circuit device is, for example, a multi-power supply device having a logic circuit on which different types of NOR flash memories are formed. The semiconductor substrate 1 has a high voltage applied transistor region 20 (which operates on 10V, for example) and a low voltage applied transistor region 30 (which operates on 3V, for example).

First of all, a field oxide film 5, having a thickness of 550 nm and used for region separation, is formed on the semiconductor substrate 1 (made of a silicon substrate, for example) in the LOCOS (Local Oxidation of Silicon) method. To form this field oxide film 5, an element formation region on the semi-conductor substrate 1 is masked, and the resultant substrate 1 is subjected to heat treatment, thereby forming the element separating region. Due to the formation of the field oxide film 5, the semiconductor substrate 1 is divided into the high voltage applied transistor region 20 and low voltage applied transistor region 30 mentioned above (FIG. 13A).

Figure 13A:
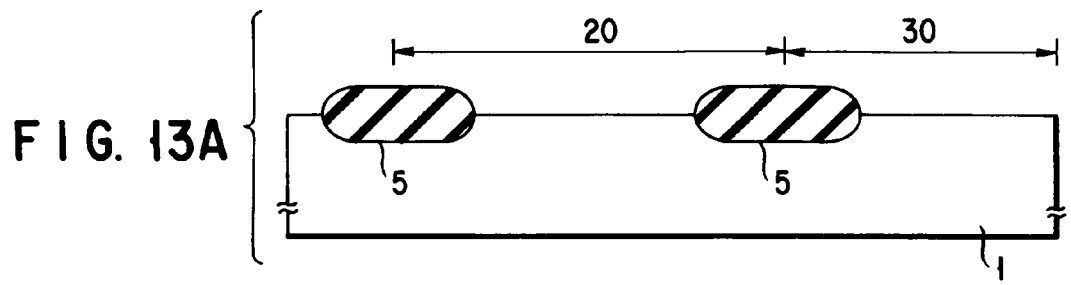
FIGS. 13A and 13B are sectional views of a semiconductor substrate and illustrate part of the process in which the semiconductor integrated circuit device of the present invention is manufactured.
Figure 13B:
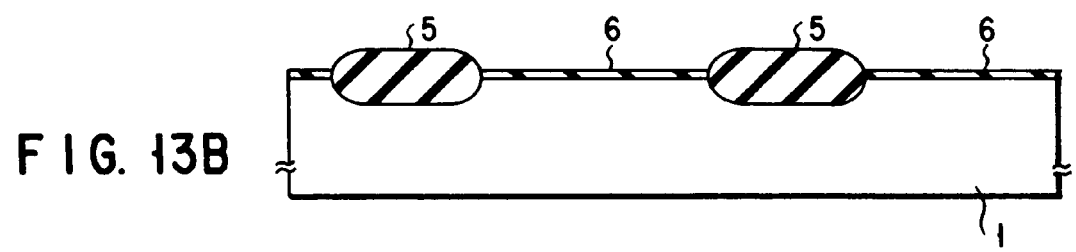

Next, a dummy gate oxide film 6 having a thickness of 15 nm or so is formed on the elements regions on the semiconductor substrate 1 by thermal oxidation (FIG. 13B).

Thereafter, photoresist 7 is coated on the semiconductor substrate 1 such that the photoresist pattern allows the high voltage applied transistor region 20 to be exposed.

Figure 14A:
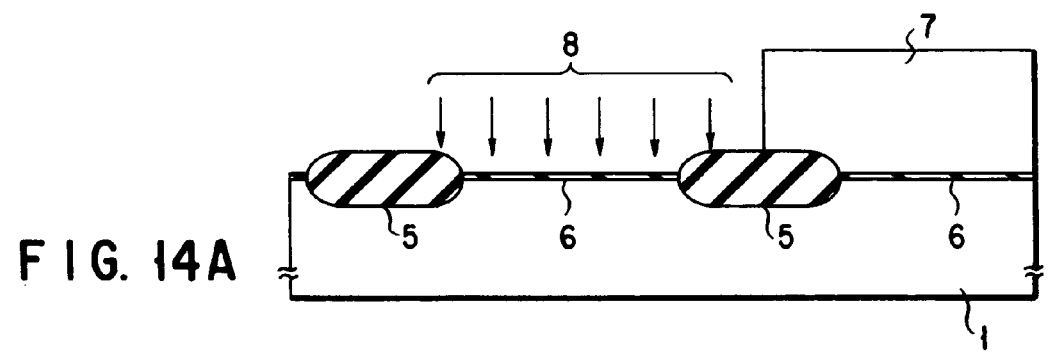
FIGS. 14A and 14B are sectional views of a semiconductor substrate and illustrate part of the process in which the semiconductor integrated circuit device of the present invention is manufactured.

Subsequently, channel ion implantation 8 is executed, using the photoresist 7 as a mask. This channel ion implantation 8 is executed under the conditions of 60 KeV and $6 \times 10^{12}$ atoms/cm$^2$ in such a manner that boron ions are implanted into the region located under the dummy gate oxide film 6 of the high voltage applied transistor region 20 (FIG. 14A).

Figure 14B:
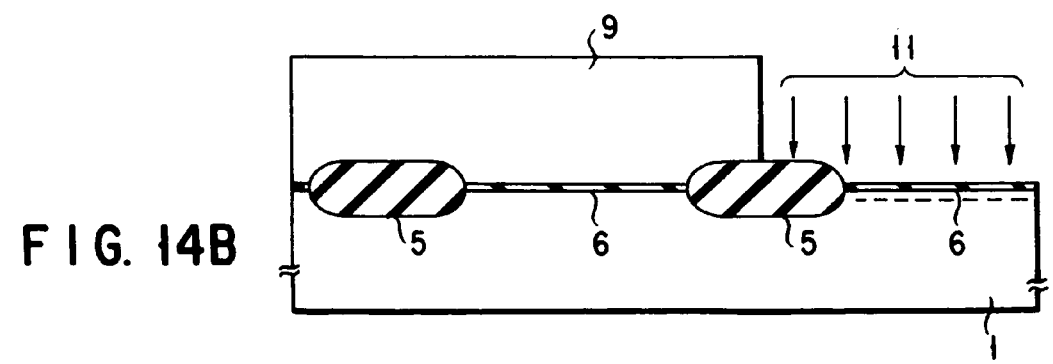

After the photoresist 7 is removed from the semiconductor substrate 1 by acid treatment, photoresist 9 is coated on the semiconductor substrate 1 such that the photoresist pattern allows the low voltage applied transistor region 30 to be exposed. Channel ion implantation 11 is executed, using the photoresist 9 as a mask. This channel ion implantation 11 is executed first under the conditions of 80 KeV and $1.5 \times 10^{12}$ atoms/cm$^2$ in such a manner that boron ions are implanted into the deep portions of the region located under the dummy gate oxide film 6 of the low voltage applied transistor region 30. Then, the channel ion implantation 11 is executed under the conditions of 40 KeV and $2.5 \times 10^{12}$ atoms/cm$^2$ in such a manner that boron ions are implanted into the shallow portions of the same region (FIG. 14B).

Figure 15A:
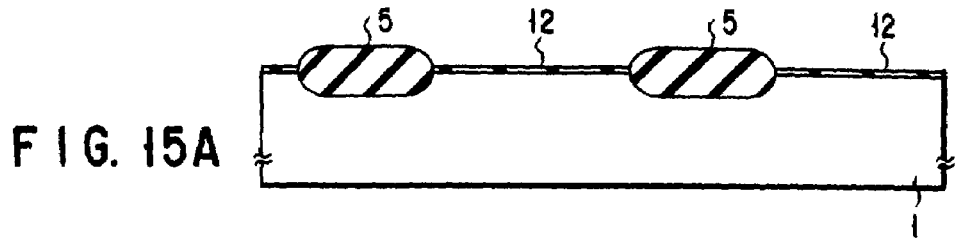
FIGS. 15A and 15B are sectional views of a semiconductor substrate and illustrate part of the process in which the semiconductor integrated circuit device of the present invention is manufactured.

After the photoresist 9 is removed by acid treatment, the dummy gate oxide film 6 is removed from the semiconductor substrate 1 by use of diluted hydrofluoric acid. Subsequently, a gate oxide film having a thickness of 18 nm or so is formed on both the high voltage applied transistor region 20 and the low voltage applied transistor region 30 (FIG. 15A).

Figure 15B:
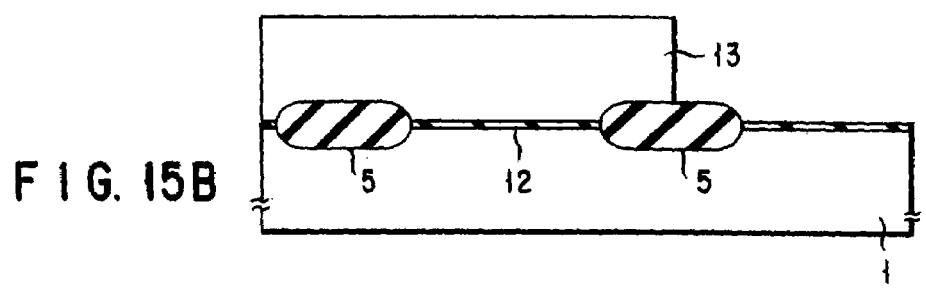

Then, photoresist 13 is coated on the semi-conductor substrate 1 in such a manner that the high voltage applied transistor region 20 is covered. With this photoresist 13 as a mask, the gate oxide film 12 is removed from the low voltage applied transistor region 30 by use of diluted hydrofluoric acid (FIG. 15B).

After the photoresist 13 is removed by acid treatment, the semiconductor substrate 1 is subjected to heat treatment so that a gate oxide film having a thickness of 10 nm or so is formed in both the high voltage applied transistor region 20 and low voltage applied transistor region 30. To be more specific, in the high voltage applied transistor region 20, the gate oxide film 12 is overlaid with another oxide film, and a gate oxide film 15 having a thickness of 20 nm or so is formed thereby. In the low voltage applied transistor region 30, the surface of the semiconductor substrate 1 is subjected to thermal oxidation, and a gate oxide film 14 having a thickness of 10 nm or so is formed thereby. In this manner, gate oxide films different in thickness are formed on the semiconductor substrate 1.

Figure 16A:
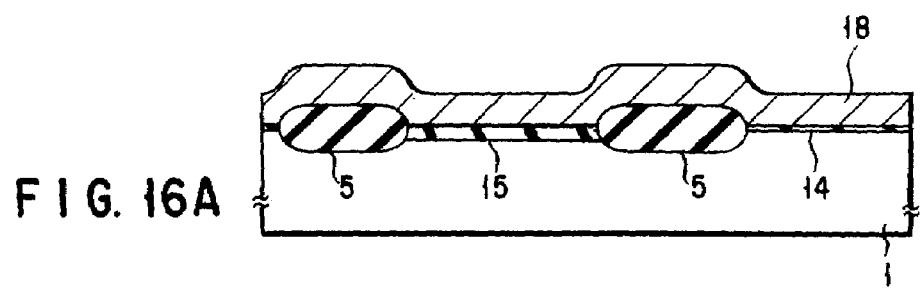
FIGS. 16A and 16B are sectional views of a semiconductor substrate and illustrate part of the process in which the semiconductor integrated circuit device of the present invention is manufactured.

Then, a polysilicon film 18 used as a gate electrode material is deposited over the entire surface of the semiconductor substrate 1 by CVD (Chemical Vapor Deposition), and then impurities such as phosphorus are diffused in the polysilicon film 18 (FIG. 16A).

Figure 16B:
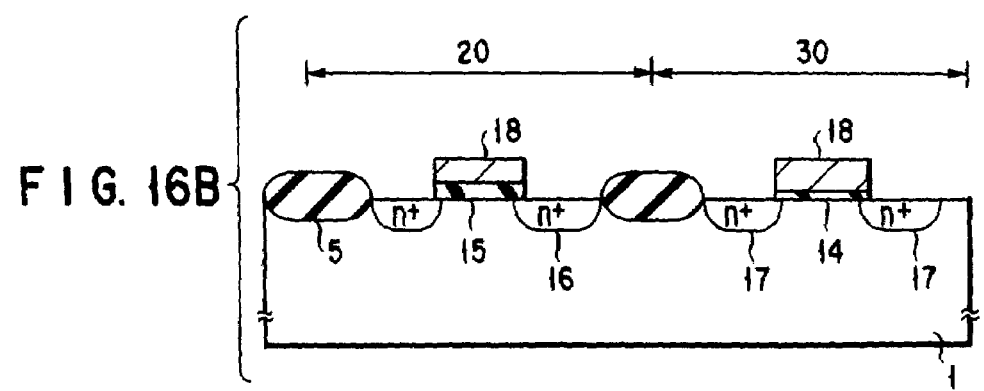

The polysilicon film 18 is patterned in such a manner that impurities-diffused regions are selectively formed on the surface of the semiconductor substrate 1. As a result, an NMOS transistor that is made up of source/drain regions 16, a gate oxide film 15 formed on the source/drain regions 16, and a gate electrode 18 formed on the gate oxide film 15, is formed in the high voltage applied transistor region 20. Likewise, an NMOS transistor that is made up of source/drain regions 17, a gate oxide film 14 formed on the source/drain regions 17, and a gate electrode 18 formed on the gate oxide film 14, is formed in the low voltage applied transistor region 30 (FIG. 16B).

In the above embodiment, the thick gate oxide film is formed by stacking two oxide films one upon the other. Needless to say, however, this does not restrict the present invention. Gate oxide films having predetermined thicknesses may be formed in the respective regions.

The above embodiment was described, referring to the case where transistors based on gate oxide films having two thicknesses are formed. Needless to say, transistors to be formed may be based on gate oxide films having three or more thicknesses. For example, the low voltage applied transistors described in the above embodiment may be divided into two types: transistors operating on power supply voltage Vdd and transistors operating on the internally-lowered voltage (which are based on the thinnest gate oxide films). In this case, the transistors of the interface circuits and those of the regulator circuit may be either the Vdd type or the high-voltage type.

A description will now be given of the internal boosting operation of a flash EEPROM.

In a circuit that is mostly constituted by analog elements, as in the read system of a semiconductor memory, the power source margin is often narrow in comparison with an ordinary CMOS logic portion. Since recently-developed devices are designed to operate on a lowered voltage than before, a special circuit design has to be considered in order to compensate for the power supply margin loss of the analog portion.

In the descriptions below, the read circuit of the flash EEPROM will be referred to. FIG. 17A is a sectional view of a memory cell of the flash EEPROM, FIG. 17B is an equivalent circuit diagram of that memory cell, and FIG. 18 is a circuit diagram of the memory cell array. In these figures, VG denotes a gate voltage, VS denotes a source voltage, and VD denotes a drain voltage.

Data is written in a memory or erased therefrom by injecting electrons into the floating gate or removing the electrons therefrom. When the floating gate contains electrons, the threshold as viewed from the control gate is high, so that the floating gate is in the OFF state. When the floating gate contains no electrons, the threshold as viewed from the control gate is low, so that the floating gate is in the ON state. In general, the threshold of the ON state is 2V or so.

In the conventional EEPROM, the power supply voltage Vdd generally used is 5V, and this level of voltage (namely, 5V) is applied directly to the control gate of a memory cell at the time of reading. The cell current Icell which is detected in the ON-state memory cell at the time of reading is represented by the following formula:

$$Icell = kVD(Vdd - Vthcell - \frac{1}{2} \cdot VD^2) \quad (1)$$

where k is a constant of proportionality.

In the case where Vthcell is 2V, the value of (Vdd−Vthcell) is 3V. In this case, a sufficient amount of cell current Icell is obtained. However, if Vdd is 3V as a result of the trend toward a decrease in the operating voltage, the value of (Vdd−Vthcell) is 1V, and a sufficient amount of cell current Icell cannot be obtained.

In order to solve this problem, it is proposed to use such a booster circuit as is shown in FIG. 19 at the time of reading. By such a booster circuit, the voltage applied to the word line of a memory cell can be boosted up to 5V or so. The booster circuit shown in FIG. 19 includes a plurality of diodes connected in series, and a plurality of capacitors each arranged between the anode and cathode of adjacent ones of the diodes. A signal of a negative phase is supplied to each capacitor from a ring oscillator.

Although the need to boost the gate voltage of a memory cell was explained above, this holds true also of the bit line potential at the time of reading.

FIG. 20 is a schematic circuit diagram showing a read circuit of the flash EEPROM. In this circuit, Vbias is held at approximately 2V to set the upper limit of bit line voltage at the time of reading. In this case, drain voltage VD is about 1V.

The small amplitude of the signal appearing at bit lines BL and /BL is amplified by a load R, and is then input to a sense amplifier 121.

This input signal is compared with a reference level Vref to determine whether the memory data is "1" or "0" (the ON state or OFF state).

What becomes a problem in relation to a low operating voltage is the resistance of a Y-selector. When the operating voltage is 5V, as in the prior art, power supply voltage Vdd is applied to the gate Tr1 of the Y-selector at the time of reading. Since the bias of the Y-selector is VG=5V and VS=1V, the resistance of the Y-selector is sufficiently low in comparison with the resistance of the cell.

However, when the power supply voltage Vdd is as low as, or lower than 2.7V, VG=2.7V and VS=1V. Since, therefore, the VGS is 1.7V, the equivalent resistance of the Y-selector is very high. That is, the resistance of the Y-selector is not negligible in comparison with the resistance of the cell, and is therefore dependent largely on the power supply voltage. This voltage dependence produces great adverse effects on the Vddmin margin of the read circuit.

To solve this problem, the voltage applied to the Y-selector at the time of reading is boosted. Since the boosted voltage is controlled to hold a constant level not affected by the power supply voltage, the peripheral elements of a cell, such as the word line and the Y-selector, are allowed to operate on the same bias in a wide range of power supply voltage. Accordingly, a stable read operation is realized.

The boosted potential described above is applicable to the source decoder. If the read potential is low, the resistance of the NMOS driver of the source decoder becomes a problem, as in the case of the Y-selector.

FIG. 21 is a schematic block circuit diagram of the flash EEPROM.

As shown in FIG. 21, the flash EEPROM includes: a control circuit 51, a column decoder 52, a row decoder 53, a block decoder 54, an input/output buffer 55, a write circuit 56, a read circuit 57, a Y-selector 58, a memory cell array 59, a source decoder 60, etc.

Figure 22:
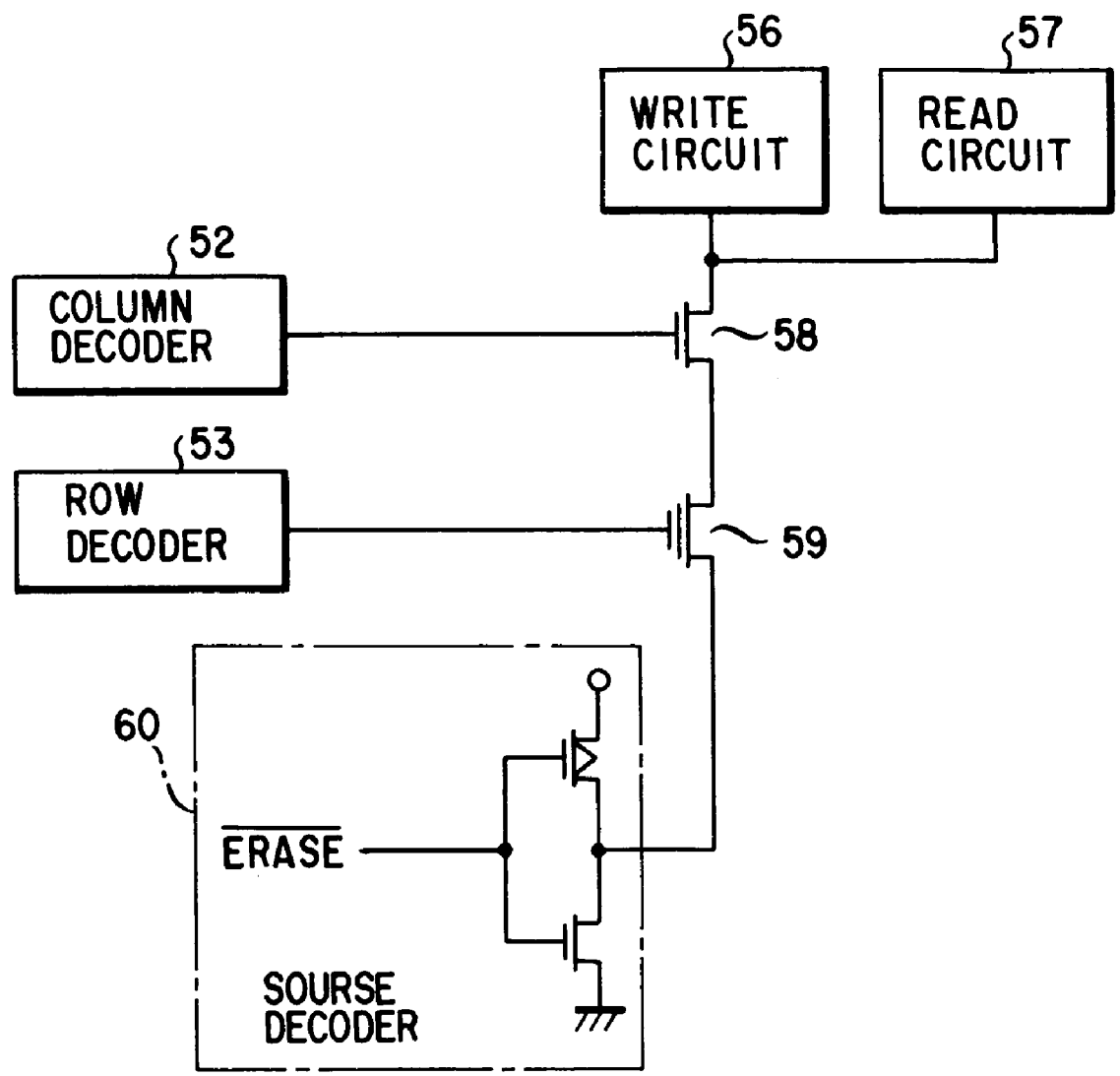
FIG. 22 shows how the memory cells of the flash EEPROM are controlled.

FIG. 22 is a block circuit diagram schematically showing those elements of the flash EEPROM which are related to the control of memory cells.

In the control system shown in FIG. 22, the source decoder 60 outputs a high-level signal at the time of erasing and a low-level signal at the other times. In the circuit diagram shown in FIG. 22, the source decoder 60 is depicted in a simplified manner and described as an inverter, the actual source decoder has a more complex function.

Since the Y-selector 58 and the source decoder 60 are applied with a high voltage at the time of writing, the transistors used in them are made of thick gate oxide film transistors (i.e., high voltage applied transistors), which, in general, are not suitable for operation on a low voltage. Therefore, application of a boosted voltage to the gate of the Y-selector 58 and the NMOS driver gate of the source decoder is very effective in attaining a stable operation at the time of reading.

With the above structure, the present invention has the following advantages:

(1) Interface

Although the operating voltage becomes lower in accordance with the trend toward the miniaturization of elements, many of the current systems still operate on 5V. It is therefore required that the range of the voltage on which devices operate be as wide as possible. This requirement is an obstacle to the miniaturization of elements. In general, in order to permit a device to operate in a wide range of power supply voltage, such as the range between 2V and 5V, the internal power supply voltage must be lowered by use of a regulator circuit. Although the excessive voltage stress acts only on the regulator circuit, this does not hold true of the interface section. That is, the power supply voltage is applied directly to the transistors of the interface. If all transistors are designed or controlled in accordance with the breakdown voltage of the interface section, this results in a hindrance to the improvement of the performance of the device. To be more specific, even if improved performance is intended by scaling the device, the device scaling itself is impossible because the transistors of the interface section are so designed as to widen the power supply voltage range within which the device is operable. To solve this problem, according to the present invention, a node which is part of an interface section and is connected directly to an external circuit is made of a thick gate oxide film transistor which has a high breakdown voltage. With this structure, a thin-film device is applied with a voltage that is within a range controllable by the internal voltage lowering. Accordingly, a plurality of transistors based on gate oxide films of two or more different thicknesses can be integrated within one chip without any deterioration in the transistor characteristics. As a result, the degree of freedom with which to design devices/circuits can be remarkably enhanced.

(2) Three-Level Control

If a thin-film device requires internal voltage lowering, as in case (1) described above, control of a third level voltage (e.g., 12V) is a very important problem. The internal elements of the chip can be protected from excessive stress by controlling the internal power supply voltage. However, the elements of the interface section are directly applied with an external voltage. In other words, the stress applied to the elements of the interface section cannot be relieved by modifying the circuit configuration of the elements. Where a transistor having a breakdown voltage of 10V or higher is employed in the interface section, as in the present invention, the stress applied to the oxide film is no longer a problem.

(3) ESD

Where the gate oxide film is thick, the electric field generated is not intense. Accordingly, the breakdown voltage against ESD can be determined to be high.

(4) If a regulator circuit is employed, the node connected to power supply source Vdd is subjected to voltage stress. This problem can be solved by using a thick gate oxide film since the use of such a film suppresses the electric field.

As detailed above, according to the present invention, a node which is in direct contact with an external circuit is made of a thick gate oxide film having a high breakdown voltage. Hence, devices made of thin gate oxide film transistors are applied with a voltage that is within a range controllable by the internal voltage lowering. Since a plurality of transistors based on gate oxide films of two or more different thicknesses can be integrated within one chip without any deterioration in the transistor characteristics, the degree of freedom with which to design devices/circuits can be remarkably enhanced. It should be also noted that the thicker a gate oxide film is, the less intense the electric field becomes. Accordingly, the breakdown voltage against ESD can be remarkably enhanced.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate on which a plurality of transistors having gate insulation films of three or more different thicknesses are formed;
   an input/output terminal formed on the semiconductor substrate, wherein a transistor physically connected directly to the input/output terminal is one of the transistors other than a transistor having the thinnest gate insulation film;
   an interface circuit connected to the input/output terminal, wherein a transistor included in the interface circuit and connected directly to the input/output terminal is one of the transistors other than the transistor having the thinnest gate insulation film, and wherein said interface circuit includes a level shifter and an output buffer circuit; and
   a regulator circuit, said level shifter converting a lowered potential level signal obtained from the regulator circuit into a power supply voltage level signal to be supplied to an external terminal,
   wherein a transistor included in the level shifter and a device directly receiving the lowered potential level signal is the transistor having the thinnest gate insulation film.

2. A semiconductor integrated circuit device according to claim 1, further comprising a power supply terminal to which an external power supply voltage is applied, wherein a transistor connected directly to the power supply terminal is one of the transistors other than the transistor having the thinnest gate insulation film.

3. A semiconductor integrated circuit device according to claim 1, further comprising a power supply terminal to which an external power supply voltage is applied and a ground terminal, wherein a transistor having a current path connected between the power supply terminal and the ground terminal is one of the transistors other than the transistor having the thinnest gate insulation film.

4. A semiconductor integrated circuit device according to claim 1, wherein a transistor included in the interface circuit and connected directly to a power supply terminal is one of the transistors other than the transistor having the thinnest gate insulation film.

5. A semiconductor integrated circuit device according to claim 4, wherein a transistor included in the interface circuit and having a current path connected between the power supply terminal and a ground terminal is one of the transistors other than the transistor having the thinnest gate insulation film.

6. A semiconductor integrated circuit device comprising:
   a semiconductor substrate on which a plurality of transistors having gate insulation films of three or more different thicknesses are formed;
   an input/output terminal formed on the semiconductor substrate, wherein a transistor connected directly to the input/output terminal, absent any intervening elements, is one of the transistors other than a transistor having the thinnest gate insulation film; and
   an interface circuit connected to the input/output terminal, wherein a transistor included in the interface circuit and connected directly to the input/output terminal is one of the transistors other than the transistor having the thinnest gate insulation film, wherein said interface circuit includes an input buffer circuit.

7. A semiconductor integrated circuit device according to claim 6, further comprising a power supply terminal to which an external power supply voltage is applied, wherein a transistor connected directly to the power supply terminal is one of the transistors other than the transistor having the thinnest gate insulation film.

8. A semiconductor integrated circuit device according to claim 6, further comprising a power supply terminal to which an external power supply voltage is applied and a ground terminal, wherein a transistor having a current path connected between the power supply terminal and the ground terminal is one of the transistors other than the transistor having the thinnest gate insulation film.

9. A semiconductor integrated circuit device according to claim 6, wherein a transistor included in the interface circuit and connected directly to a power supply terminal is one of the transistors other than the transistor having the thinnest gate insulation film.

10. A semiconductor integrated circuit device according to claim 9, wherein a transistor included in the interface circuit and having a current path connected between the power supply terminal and a ground terminal is one of the transistors other than the transistor having the thinnest gate insulation film.

11. A semiconductor integrated circuit device comprising:
   a semiconductor substrate on which a plurality of transistors having gate insulation films of three or more different thicknesses are formed;

an input/output terminal formed on the semiconductor substrate, wherein a transistor connected directly to the input/output terminal, absent any intervening elements, is one of the transistors other than a transistor having the thinnest gate insulation film;

an interface circuit connected to the input/output terminal, wherein a transistor included in the interface circuit and connected directly to the input/output terminal is one of the transistors other than the transistor having the thinnest gate insulation film, and wherein said interface circuit includes a level shifter and an output buffer circuit; and a regulator circuit, said level shifter converting a lowered potential level signal obtained from the regulator circuit into a power supply voltage level signal to be supplied to an external terminal, wherein a transistor included in the level shifter and a device directly receiving the lowered potential level signal is the transistor having the thinnest gate insulation film.

12. A semiconductor integrated circuit device according to claim 11, further comprising a power supply terminal to which an external power supply voltage is applied, wherein a transistor connected directly to the power supply terminal is one of the transistors other than the transistor having the thinnest gate insulation film.

13. A semiconductor integrated circuit device according to claim 11, further comprising a power supply terminal to which an external power supply voltage is applied and a ground terminal, wherein a transistor having a current path connected between the power supply terminal and the ground terminal is one of the transistors other than the transistor having the thinnest gate insulation film.

14. A semiconductor integrated circuit device according to claim 11, wherein a transistor included in the interface circuit and connected directly to a power supply terminal is one of the transistors other than the transistor having the thinnest gate insulation film.

15. A semiconductor integrated circuit device according to claim 14, wherein a transistor included in the interface circuit and having a current path connected between the power supply terminal and a ground terminal is one of the transistors other than the transistor having the thinnest gate insulation film.

16. A semiconductor integrated circuit device comprising:
a semiconductor substrate on which a plurality of transistors having gate insulation films of three or more different thicknesses are formed;

an input/output terminal formed on the semiconductor substrate, wherein a transistor always connected directly to the input/output terminal is one of the transistors other than a transistor having the thinnest gate insulation film;

an interface circuit connected to the input/output terminal, wherein a transistor included in the interface circuit and connected directly to the input/output terminal is one of the transistors other than the transistor having the thinnest gate insulation film, and wherein said interface circuit includes a level shifter and an output buffer circuit; and a regulator circuit, said level shifter converting a lowered potential level signal obtained from the regulator circuit into a power supply voltage level signal to be supplied to an external terminal, wherein a transistor included in the level shifter and a device directly receiving the lowered potential level signal is the transistor having the thinnest gate insulation film.

17. A semiconductor integrated circuit device according to claim 16, further comprising a power supply terminal to which an external power supply voltage is applied, wherein a transistor connected directly to the power supply terminal is one of the transistors other than the transistor having the thinnest gate insulation film.

18. A semiconductor integrated circuit device according to claim 16, further comprising a power supply terminal to which an external power supply voltage is applied and a ground terminal, wherein a transistor having a current path connected between the power supply terminal and the ground terminal is one of the transistors other than the transistor having the thinnest gate insulation film.

19. A semiconductor integrated circuit device according to claim 16, wherein a transistor included in the interface circuit and connected directly to a power supply terminal is one of the transistors other than the transistor having the thinnest gate insulation film.

20. A semiconductor integrated circuit device according to claim 19, wherein a transistor included in the interface circuit and having a current path connected between the power supply terminal and a ground terminal is one of the transistors other than the transistor having the thinnest gate insulation film.

* * * * *